US006885604B1

United States Patent
Ott

(10) Patent No.: US 6,885,604 B1
(45) Date of Patent: Apr. 26, 2005

(54) CASCODE FUSE DESIGN

(75) Inventor: Patrick J. Ott, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/916,193

(22) Filed: Aug. 10, 2004

(51) Int. Cl.[7] .............................................. G11C 17/16

(52) U.S. Cl. .................... 365/225.7; 365/208; 365/207; 365/226; 365/201; 365/96

(58) Field of Search .............................. 365/225.7, 208, 365/207, 206, 210, 226, 201, 96, 94

(56) References Cited

U.S. PATENT DOCUMENTS

| 5,477,499 | A | * | 12/1995 | Van Buskirk et al. | ... 365/185.3 |
| 5,579,274 | A | * | 11/1996 | Van Buskirk et al. | .. 365/185.21 |
| 6,532,174 | B2 | * | 3/2003 | Homma et al. | .......... 365/185.2 |
| 6,735,120 | B2 | * | 5/2004 | Homma et al. | .......... 365/185.2 |

* cited by examiner

Primary Examiner—Andrew Q. Tran
(74) Attorney, Agent, or Firm—Schwabe, Williamson & Wyatt, P.C.

(57) ABSTRACT

A fuse cell comprises a plurality of fuse elements, a plurality of cascode configuration programming circuits correspondingly coupled to the fuse elements, and a plurality of cascode configuration sensing circuits correspondingly coupled to the fuse elements.

27 Claims, 5 Drawing Sheets

CASCODE FUSE DESIGN

FIELD OF THE INVENTION

The present invention relates in general to the field of integrated circuits and, in particular, to fuse cell design in integrated circuits.

BACKGROUND

Data may be stored in integrated circuit elements of various types. When power is applied to a circuit, the data operated on by a controller may be stored in temporary, volatile memory. When the power to the circuit containing this temporary, volatile memory is removed, however, the data in the temporary, volatile memory is lost. Other types of non-volatile, but rewritable, elements such as EEPROMs and NVRAMs are utilized to store information that is maintained after power is removed from a circuit containing these elements. Another type of element that may be utilized in integrated circuits to store information are one time programmable elements. These one time programmable elements may contain information that has been written to the elements once and then used in a read-only manner. Such one time programmable elements may be implemented utilizing various technologies.

One type of technology utilized to provide one-time programmability is fuse cells. Fuse cells typically provide the ability for a logic value to be determined by programming the fuse cell by "blowing" or programming one or more fuse elements. An ideal fuse element may be one that acts as a short circuit when not programmed and an open circuit when programmed. Actual fuse elements, however, may only approximate short circuits and open circuits when not programmed and programmed, respectively. That is to say that actual fuse elements typically have associated with them a low resistive state and a high resistive state.

BRIEF DESCRIPTION OF DRAWINGS

Embodiments of the present invention will be described referencing the accompanying drawings in which like references denote similar elements, and in which.

DETAILED DESCRIPTION OF THE EMBODIMENTS

Figure 1:
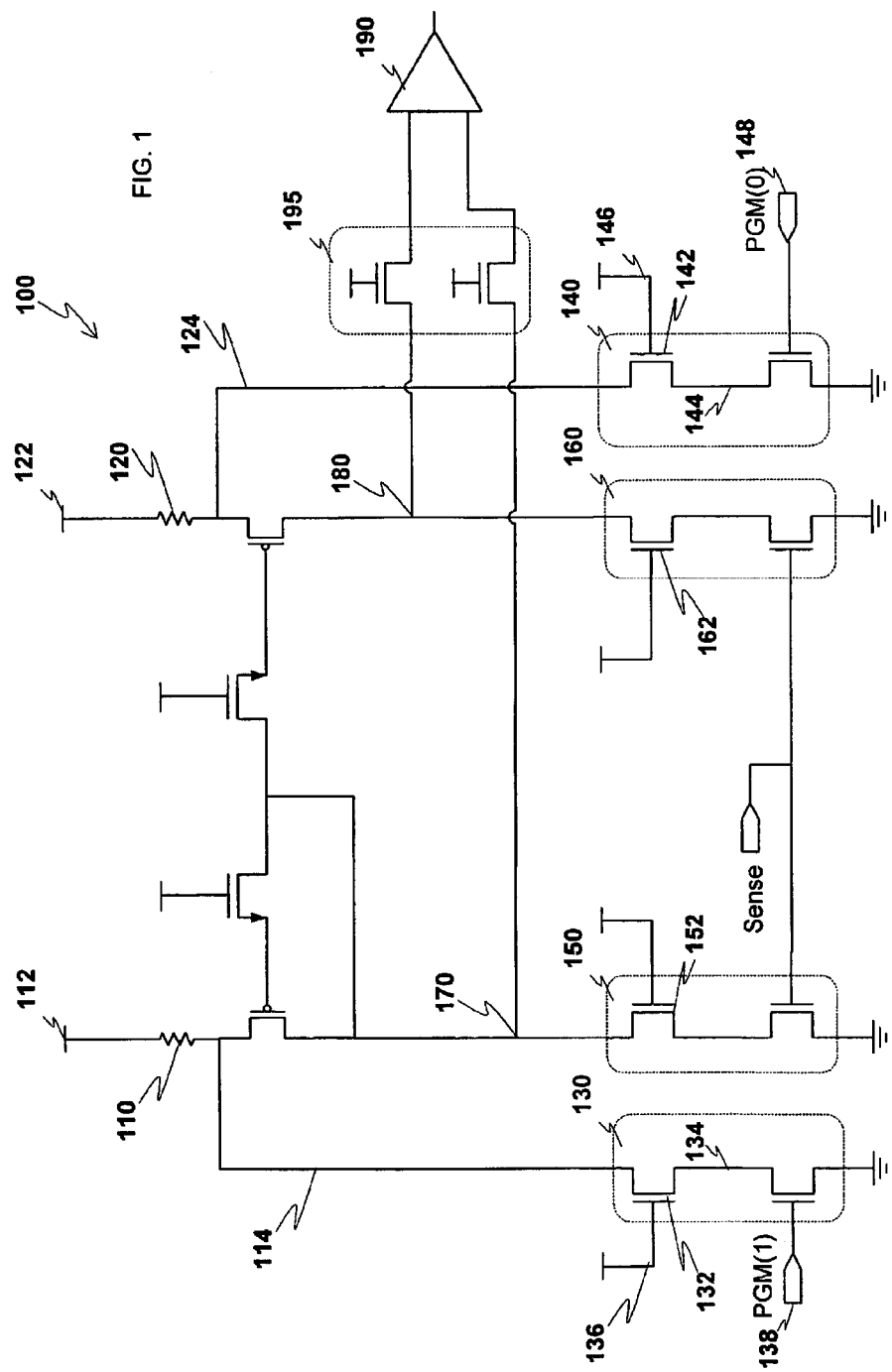
FIG. 1 illustrates a n-type metal oxide semiconductor field effect transistor (NMOS) cascode fuse cell, in accordance with one embodiment.

Various aspects of illustrative embodiments of the invention will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials, and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

The phrase "in one embodiment" is used repeatedly. The phrase generally does not refer to the same embodiment; however, it may. The terms "comprising", "having" and "including" are synonymous, unless the context dictates otherwise.

Feature sizes for microelectronic circuits continue to shrink. Coinciding with this shrinkage in features size is a reduction in the operating voltages of these microelectronic circuits. As previously mentioned, in circuits containing fuse elements, the actual fuse elements may only approximate short circuits and open circuits. As such, the native fuse elements assume a low resistance value while programmed fuses assume a high resistance value approximating the short and open circuits, respectively. As the feature sizes and voltages decrease, however, challenges arise as it becomes more difficult to differentiate between the low and high resistance values. Such challenges may create problems in distinguishing a proper logic value associated with a fuse element after the fuse cell has been programmed. For example, in one embodiment of a fuse cell, two fuse elements are utilized. Prior to programming, both fuse elements have a low resistive value. During programming of the fuse cell, one of the two fuse elements is programmed, i.e. set to a high resistance state, and one of the two fuse elements is unchanged, i.e. left at a low resistive state. Depending on which of the two fuse elements are set to a high resistive state, the fuse cell can determine a logic "0" value or a logic "1," value. When the fuse cell is read, the two fuse elements may be "sensed" by, for example, determining a voltage drop across the fuse elements relative to one another.

There are times when programming of fuse elements of fuse cells in microelectronic circuits does not program the fuse elements in a manner to sufficiently distinguish a properly programmed logic value. This may result from a number of issues. For example, this may be due to an insufficient programming voltage being applied across a fuse element during programming. Frequently, in order to assure the proper programming of a fuse element, the programming of fuse elements involves the use of voltages that are higher than voltages used in a normal operation of the fuse cells containing the fuse elements to be programmed. For example, in sense, or read, operations of circuits containing programmed information in fuse cells, the sense operations may utilize a supply voltage, $V_{CC}$. In contrast, during a period of programming of the information in the fuse elements of the fuse cell, a supply voltage different from $V_{CC}$ may be utilized in the programming process. For example, in one embodiment, the supply voltage utilized when programming fuse elements of a fuse cell may be twice a supply voltage used during a sensing operation. To provide the ability to operate with voltages as high as e.g. twice the normal supply voltage, various circuits have been devised. As many of these circuits require special manufacturing steps during the manufacture of these circuits, difficulties sometime arise in their implementation.

FIG. 1 illustrates a n-type metal oxide semiconductor field effect transistor (NMOS) cascode fuse cell, in accordance with one embodiment. The fuse elements 110 120 may be programmed to represent one of two logic values for the cell.

The fuse elements 110 120 may be of any type of fuse technology. That is to say fuse elements 110 120 are elements that, when programmed, obtain a relatively high resistance. In contrast, an unprogrammed fuse element may have a relatively low resistance. Examples of fuse technologies include poly fuses and metal fuses. During a programming operation, the voltage at nodes $V_{SUPPLY}$ 112 122 may be twice the normal operating supply voltage which is supplied at $V_{SUPPLY}$ 112 122. For example, during sensing the voltage at nodes $V_{SUPPLY}$ 112 122 may be at a voltage $V_{CC}$. Whereas, during programming, the voltage at nodes $V_{SUPPLY}$ 112 122 may be at a voltage $2*V_{CC}$.

This higher voltage which may be utilized during a programming operation may be problematic for standard metal oxide semiconductor devices due to, among other things, the stress they bring to a gate oxide layer. For a given technology, a gate oxide thickness may be designed to provide certain features. These features may not support an ability to have voltages across a gate/drain or gate/source that are over a certain value. For example, if twice the supply voltage ($V_{CC}$) is applied to the drain of an NMOS device while the gate of the NMOS device is biased with a ground reference voltage, this $V_{GD}$ voltage equal to $2*V_{CC}$ may likely induce a failure of the NMOS device through, at least, the stresses on the gate oxide layer. Thus, care should be taken in the design of circuits utilizing a programming voltage higher than a normal operating system voltage.

The embodiments herein disclose the use of a cascode configuration for, among other things, the programming and sensing of fuse elements. As illustrated in the embodiment of FIG. 1, two cascoded NMOS devices, e.g. an NMOS cascode pair, may be utilized to program the fuse elements in the fuse cell. There may be two NMOS cascode pairs 130 140 for the programming of a fuse cell 100 with two fuse elements 110 120. A voltage, $V_{PROG}$, approximately equal to twice a normal supply voltage, $V_{CC}$, may be applied to nodes $V_{SUPPLY}$ 112 122 during programming. Gates 136 146 of upper cascode devices 132 142 of the NMOS cascode pairs 130 140 are biased with a voltage equal to $V_{CC}$. This limits the upper voltage levels on the cascode midpoints 134 144 to $V_{CC}-V_T$. This may result in the voltage across both gate oxide layers (i.e. $V_{GS}$ and $V_{GD}$) for the upper and lower cascode device not exceeding $V_{CC}$.

During programming, however, when one of the program signals 138 148 is asserted, the voltage levels on the corresponding cascode midpoints 134 144 may drop to effectively a ground potential. This turns-on the corresponding upper cascode device 132 142 resulting in a voltage at nodes 114 124 of effectively a ground potential. Thus, a substantially full voltage of $2*V_{CC}$ occurs across the fuse elements 110 120 during programming which may provide for a more completely programmed fuse element.

Other portions of fuse cell 100 of the embodiment of FIG. 1 may also be protected by cascode configurations. Using a cascode configuration may also protect the sense circuitry. In the embodiment illustrated, the sense circuitry comprises two NMOS cascode pairs 150 160. As with the programming circuitry, the gates of the upper cascode devices 152 162 of the programming circuitry are biased with a voltage equal to $V_{CC}$. This results in the same protection for the sense circuitry as that provided to the programming circuitry during programming of the fuse cell. A differential amplifier 190 may be utilized to determine the difference in voltage between nodes 170 180. Cascode devices 195 are utilized to provide protection to the input stage logic of differential amplifier 190. Note that, in alternative embodiments, a single ended amplifier can be used to determine the logical state of the fuse cell by only monitoring the voltage of node 170.

Figure 2:
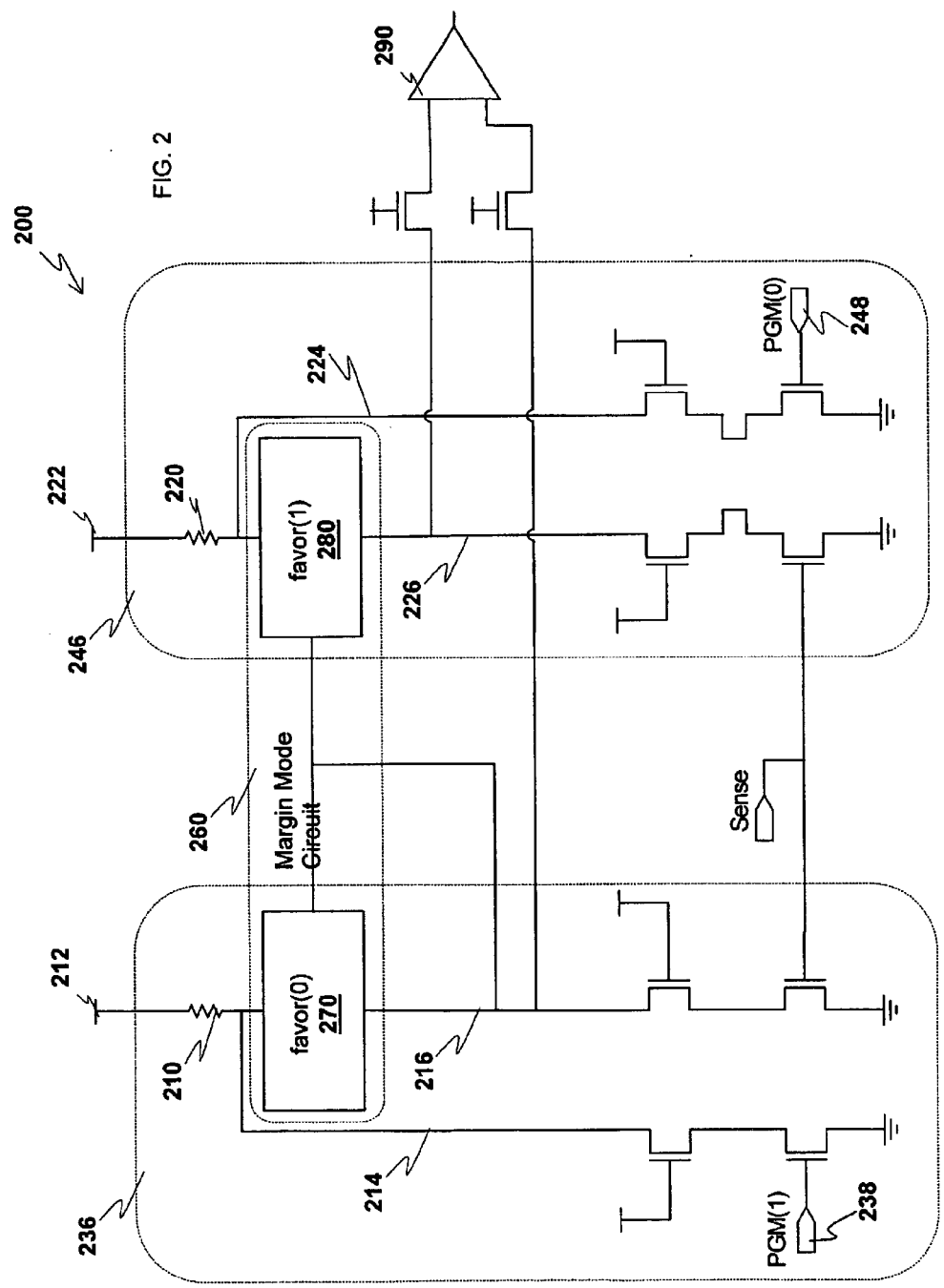
FIG. 2 illustrates a cascode type fuse cell with a margin mode control circuit, in accordance with one embodiment.

FIG. 2 illustrates a cascode type fuse cell 200 with a margin mode control circuit 260, in accordance with one embodiment. During the testing of fuse cells, it may be desirable to determine how well a fuse cell has been programmed. That is to say, it may be desirable to test how strongly a cell is programmed to one logic value or another. In such a case, it may be possible to provide circuitry to "bias" the fuse cell in a test mode towards an opposite logic value from which it was programmed. For example, assume the fuse cell 210 is programmed to a logic "1" by having asserted a signal on the first program node 238, PGM(1) during programming. This may result in a high resistance value for fuse element 210. Favor(0) circuit 270 may be utilized to provide a bias towards a logic value opposite (e.g. a logic "0") that expected of the fuse cell as a result of being programmed at the first program node 238. Similarly, favor (1) circuit 280 may be utilized to provide a bias towards a logic value opposite that expected when the fuse element 220 is programmed at a second program node 248, PGM(0). Various nodes 214–216 224–226 are illustrated to show connectivity with subsequent figures.

Figure 3:
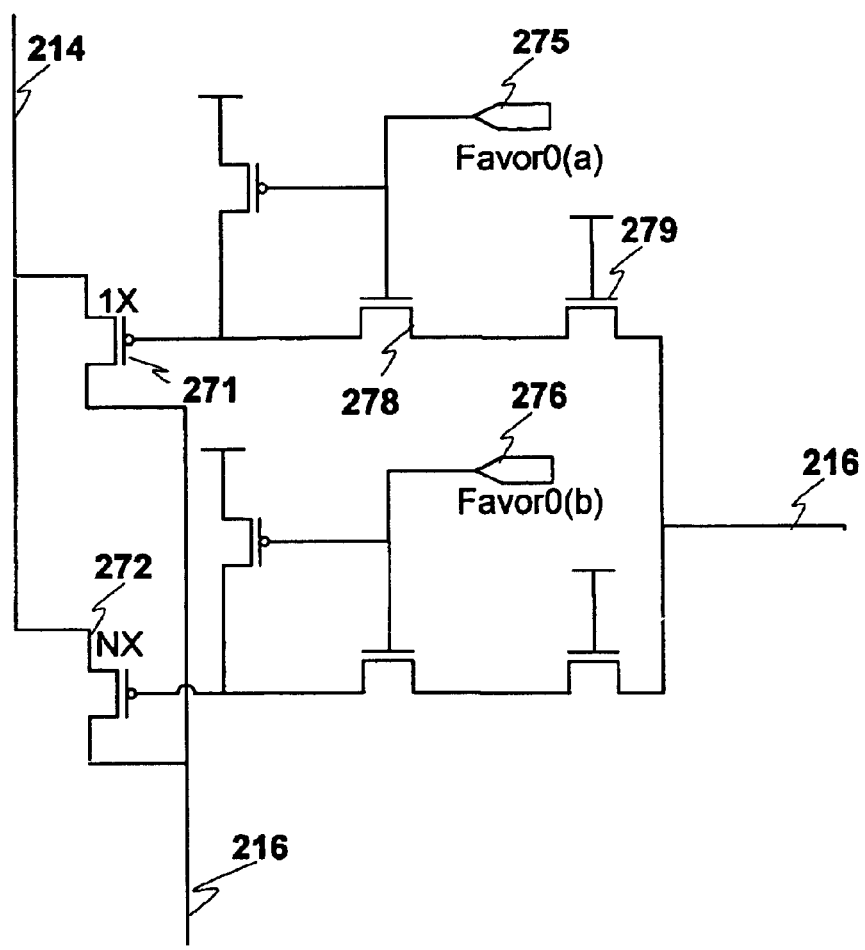
FIG. 3 illustrates a detailed look at the favor(0) circuitry of the margin mode circuit of FIG. 2, in accordance with one embodiment.

FIG. 3 illustrates a detailed look at the favor(0) circuitry 270 of the margin mode circuit 260 of FIG. 2, in accordance with one embodiment. As previously mentioned, the favor (0) circuitry 270 may be utilized to "favor" a logic value for a fuse cell opposite a logic value to which a fuse cell is programmed. Referring again to FIG. 2, during a sense operation, the differential amplifier 290 determines a difference in the voltages at nodes 216 and 226. The favor(0) circuitry 270 illustrated in FIG. 3, shows parallel P-type metal-oxide-semiconductor field-effect transistor (PMOS) devices 271–272 which may be selectively enabled in series with fuse element 210 to control the effective resistance between nodes 216 and 212. The PMOS devices 271–272, and hence the effective resistance, are controlled via inputs favor0(a) 275 and favor0(b) 276. The parallel PMOS devices 271–272 may have an on resistance that differ between devices. For example device 271 may have a resistance of "x". Device 272 may have a resistance of "N times x". In this manner various resistance values may be effectively placed in series with fuse element 210 to test the margin at which the differential amplifier will still provide a proper logic output "0". If the resistance of the programmed element is too low it can be detected by increasing the resistance of the opposite fuse element branch until the polarity of the output node changes state; thereby detecting a partially programmed fuse. While the favor(0) 270 circuitry is illustrated with 2 parallel PMOS devices, it is understood that additional devices may be utilized to form different resistance configurations.

In the embodiment illustrated, the margin mode control circuit utilizes a cascode configuration. Referring again to FIG. 2, node 216 may obtain a voltage of approximately $2*V_{CC}$ during programming. In the margin mode control circuits, cascode configurations may be utilized to provide protection the favor logic. For example, to avoid the possibility of $2*V_{CC}$ from occurring across the gate/drain of NMOS 278, transistor 279 is utilized and has its gate tied to $V_{CC}$. Thus, when node 216 rises to twice VCC the VGD voltage across NMOS 278 is still, at most, VCC, thereby protecting NMOS 278.

Figure 4:
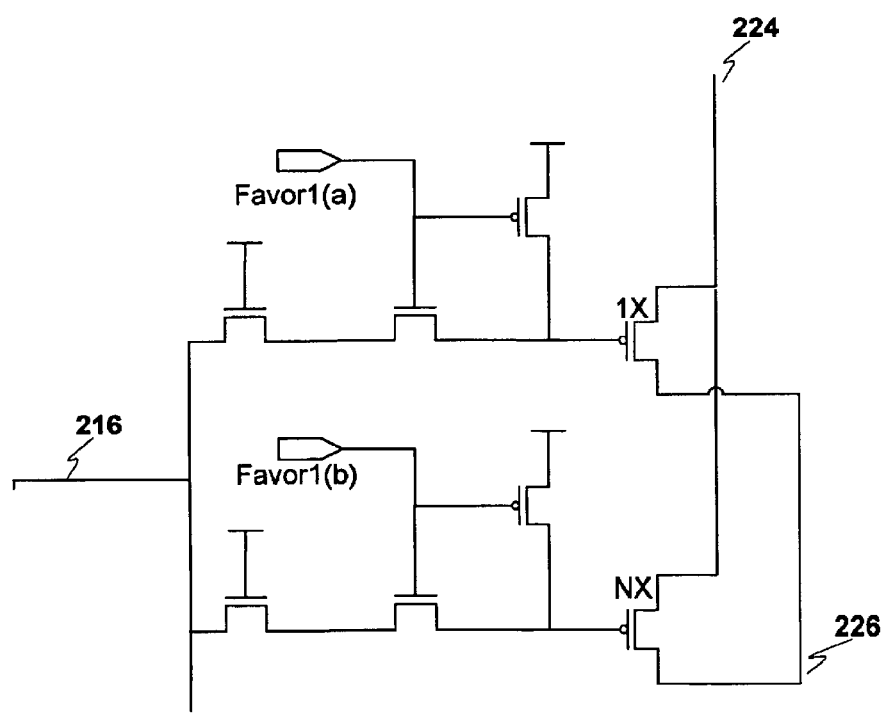
FIG. 4 illustrates a detailed look at the favor(1) circuitry of the margin mode circuit of FIG. 2, in accordance with one embodiment.

FIG. 4 illustrates a detailed look at the favor(1) circuitry 280 of the margin mode circuit 250 of FIG. 2, in accordance with one embodiment. The favor(1) circuitry 280 may be utilized to check how well the circuit has been programmed to a logic "0" value. Similar to the circuitry of FIG. 3, the favor(1) circuitry 280 may be utilized to provide a series resistance to the logic "0" fuse element 220, to aid in the testing of the margins at which the logic "0" fuse element 220 will operate properly.

Figure 5:
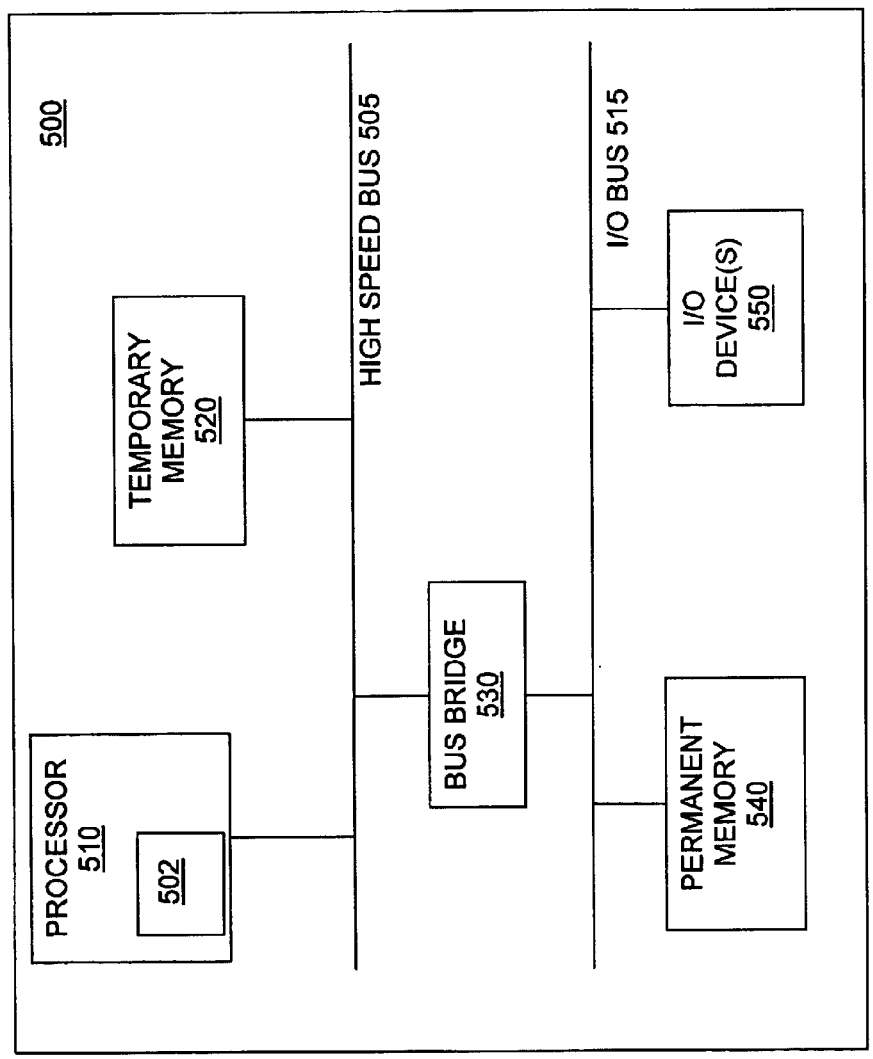
FIG. 5 illustrates is a block diagram of a computer system including an integrated circuit having a fuse cell of one of the described embodiments.

FIG. 5 illustrates is a block diagram of a computer system 500 including an integrated circuit having an embodiment of a fuse cell 502. As shown, the computer system 500 includes the processor 510 and temporary memory 520, such as SDRAM and DRAM, on high-speed bus 505. High-speed bus is connected through bus bridge 530 to input/output (I/O) bus 515. I/O bus 515 connects permanent memory 540, such as flash devices and mass storage device (e.g. fixed disk device), and I/O devices 550 to each other and bus bridge 530. One or more of the enumerated integrated circuit elements, such as processor 510 may contain an embodiment of a fuse cell 502. Similarly, one or more components, such as bus bridge 530 may contain one or more of the integrated circuits.

In various embodiments, system 500 may be a hand held computing device, a mobile phone, a digital camera, a tablet computer, a laptop computer, a desktop computer, a set-top box, a CD player, a DVD player, or a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. While the above circuits have been described with reference to particular logic levels, it is recognized that logic levels are arbitrary and the above circuits may be been described using different logic elements. It is to be recognized that other devices may be utilized without deviating from the scope of the embodiments presented herein. This application is intended to cover any adaptations or variations of the embodiments discussed herein. Therefore, it is manifestly intended that this invention be limited only by the claims and the equivalents thereof.

What is claimed is:

1. A fuse cell comprising:
   a plurality of fuse elements;
   a plurality of cascode configuration programming circuits correspondingly coupled to the fuse elements; and
   a plurality of cascode configuration sensing circuits correspondingly coupled to the fuse elements.

2. The apparatus of claim 1 wherein at least one of the plurality of cascode configuration programming circuits comprises a plurality of serially coupled n-type metal-oxide-semiconductor-field-effect transistors.

3. The apparatus of claim 2 wherein a gate of a first n-type metal-oxide-semiconductor-field-effect transistor of the plurality of serially coupled n-type metal-oxide-semiconductor-field-effect transistors is coupled to a signal trace configured to be driven with a supply voltage during both a programming operation and a sensing operation.

4. The apparatus of claim 1 wherein at least one of the plurality of cascode configuration sensing circuits comprises two serially coupled n-type metal-oxide-semiconductor-field-effect transistors.

5. The apparatus of claim 4 wherein a gate of a first n-type metal-oxide-semiconductor-field-effect transistor of the two serially coupled n-type metal-oxide-semiconductor-field-effect transistors is coupled to a signal trace configured to be driven with a supply voltage during both a programming operation and a sensing operation.

6. The apparatus of claim 1 wherein the plurality of fuse elements comprises a plurality of polysilicon fuse elements.

7. The apparatus of claim 1 wherein the plurality of fuse elements comprises a plurality of metal fuse elements.

8. The apparatus of claim 1 further comprising a margin mode control circuit coupled to the fuse elements and the plurality of cascode configuration sensing circuits.

9. The apparatus of claim 8 wherein the margin mode control circuit comprises a plurality of p-type metal-oxide-semiconductor-field-effect transistors and a plurality of input signal traces.

10. The apparatus of claim 9 wherein the plurality of input signal traces are correspondingly coupled to the plurality of p-type metal-oxide-semiconductor-field-effect transistors.

11. The apparatus of claim 10 wherein the plurality of input signal traces and the plurality of p-type metal-oxide-semiconductor-field-effect transistors are configurable to programmably bias the resistivity associated with at least one of said plurality of fuse elements.

12. The apparatus of claim 1 further comprising a differential amplifier coupled to the plurality of cascode configuration sensing circuits.

13. A method of operating a fuse cell comprising:
   during a programming operation of a fuse element utilizing a first cascode configuration circuit to program the fuse element; and
   during a sensing operation of a fuse element utilizing a second cascode configuration circuit to sense the fuse element.

14. The method of claim 13 wherein the programming operation comprises applying a voltage to the fuse element that is a multiple of a voltage applied to the fuse element during the sensing operation.

15. The method of claim 13 wherein the first and second cascode configuration circuit comprise a plurality of serially coupled n-type metal-oxide-semiconductor-field-effect transistors.

16. A system comprising:
   a semiconductor component including:
      a fuse cell comprising:
         a plurality of fuse elements;
         a plurality of cascode configuration programming circuits correspondingly coupled to the fuse elements; and
         a plurality of cascode configuration sensing circuits correspondingly coupled to the fuse elements;
   a mass storage device; and
   at least one bus coupled between the semiconductor component and the mass storage device to facilitate data exchange between the semiconductor component and the mass storage device.

17. The system of claim 16 wherein at least one of the plurality of cascode configuration programming circuits comprises a plurality of serially coupled n-type metal-oxide-semiconductor-field-effect transistors.

18. The system of claim 17 wherein a gate of a first n-type metal-oxide-semiconductor-field-effect transistor of the plurality of serially coupled n-type metal-oxide-semiconductor-field-effect transistors is coupled to a signal trace configured to be driven with a supply voltage during both a programming operation and a sensing operation.

19. The system of claim 16 wherein at least one of the plurality of cascode configuration sensing circuits comprises two serially coupled n-type metal-oxide-semiconductor-field-effect transistors.

20. The system of claim 19 wherein a gate of a first n-type metal-oxide-semiconductor-field-effect transistor of the two serially coupled n-type metal-oxide-semiconductor-field-effect transistors is coupled to a signal trace configured to be driven with a supply voltage during both a programming operation and a sensing operation.

21. The system of claim 16 wherein the plurality of fuse elements comprises a plurality of polysilicon fuse elements.

22. The system of claim 16 wherein the plurality of fuse elements comprises a plurality of metal fuse elements.

23. The system of claim 16 further comprising a margin mode control circuit coupled to the fuse elements and the plurality of cascode configuration sensing circuits.

24. The system of claim 23 wherein the margin mode control circuit comprises a plurality of p-type metal-oxide-semiconductor-field-effect transistors and a plurality of input signal traces.

25. The system of claim 24 wherein the plurality of input signal traces are correspondingly coupled to the plurality of p-type metal-oxide-semiconductor-field-effect transistors.

26. The system of claim 25 wherein the plurality of input signal traces and the plurality of p-type metal-oxide-semiconductor-field-effect transistors are configurable to programmably bias the resistivity associated with at least one of said plurality of fuse elements.

27. The system of claim 16 further comprising a differential amplifier coupled to the plurality of cascode configuration sensing circuits.

* * * * *

UNITED STATES PATENT AND TRADEMARK OFFICE
CERTIFICATE OF CORRECTION

PATENT NO. : 6,885,604 B1
APPLICATION NO. : 10/916193
DATED : April 26, 2005
INVENTOR(S) : Ott It is certified that error appears in the above-identified patent and that said Letters Patent is hereby corrected as shown below:

Col. 6, line 39, "...circuit comprise..." should read --...circuits comprise...--.

Signed and Sealed this

Twelfth Day of September, 2006

JON W. DUDAS
*Director of the United States Patent and Trademark Office*